United States Patent
Adrian

(10) Patent No.: US 10,681,847 B1
(45) Date of Patent: Jun. 9, 2020

(54) EXTERNALLY-COOLED TAPE DRIVE

(71) Applicant: Microsoft Technology Licensing, LLC, Redmond, WA (US)

(72) Inventor: Jason David Adrian, Woodinville, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

(21) Appl. No.: 16/359,233

(22) Filed: Mar. 20, 2019

Related U.S. Application Data

(60) Provisional application No. 62/814,029, filed on Mar. 5, 2019.

(51) Int. Cl.
| | |
|---|---|
| *H05K 7/20* | (2006.01) |
| *H01L 23/427* | (2006.01) |
| *G06F 1/20* | (2006.01) |
| *H05K 1/18* | (2006.01) |
| *H05K 5/02* | (2006.01) |

(52) U.S. Cl.
CPC .......... *H05K 7/208* (2013.01); *G06F 1/20* (2013.01); *H01L 23/427* (2013.01); *H05K 1/181* (2013.01);
(Continued)

(58) Field of Classification Search
CPC ...... G06F 1/20; G06F 1/206; G06F 2200/201; G06F 1/26; G06F 1/187; G06F 1/182; G06F 3/0689; G06F 1/181; H01L 23/473; H01L 23/34; H01L 23/427; H01L 23/42; H01L 23/367; H05K 7/20836; H05K 7/20781; H05K 7/20772; H05K 7/20727; H05K 7/20; H05K 7/20736; H05K 7/20136; H05K 7/20763; H05K 5/06; H05K 7/20127; H05K 1/181; H05K 7/20809; H05K 7/20745; H05K 7/2079; H05K 7/20818; H05K 5/0256; H05K 7/1427; H05K 7/20827;
(Continued)

(56) References Cited

U.S. PATENT DOCUMENTS

| | | | |
|---|---|---|---|
| 5,433,397 A | * | 7/1995 | Lalouette ............... G11B 15/32 242/340 |
| 5,731,954 A | | 3/1998 | Cheon |

(Continued)

FOREIGN PATENT DOCUMENTS

TW          M370836 U          12/2009

OTHER PUBLICATIONS

Mochizuki et al., "A Review of Heat Pipe Application Including New Opportunities", Fujkura Ltd., Tokyo, Japan, Frontiers in Heat Pipes (FHP), 2, 013001 (2011), DOI: 10.5098/fhp.v2.1.3001, ISSN: 2155-658X. 15 pp.

*Primary Examiner* — Adam B Dravininkas
(74) *Attorney, Agent, or Firm* — Buckley, Maschoff & Talwalkar LLC

(57) ABSTRACT

A tape drive includes a housing defining an internal volume, a heat-generating element disposed within the internal volume, a thermally-conductive element, a first end of the thermally-conductive element in thermal communication with the heat-generating element, and a heat dissipation unit disposed in an external volume outside of the internal volume, wherein a second end of the thermally-conductive element is disposed in the external volume and is in thermal communication with the heat dissipation unit.

16 Claims, 6 Drawing Sheets

(52) U.S. Cl.
CPC ....... *H05K 5/0256* (2013.01); *H05K 7/20763* (2013.01)

(58) Field of Classification Search
CPC ............. H05K 7/1422; H05K 7/20963; H05K 7/20754; H05K 7/20254; H05K 7/20263; H05K 7/20281; H05K 7/20272; H05K 7/208
See application file for complete search history.

(56) References Cited

U.S. PATENT DOCUMENTS

| | | | |
|---|---|---|---|
| 6,105,662 A | 8/2000 | Suzuki | |
| 6,373,696 B1* | 4/2002 | Bolognia | G06F 1/184 361/679.33 |
| 6,529,377 B1 | 3/2003 | Nelson et al. | |
| 8,427,831 B2 | 4/2013 | Wei | |
| 2002/0093760 A1* | 7/2002 | Okunaga | G11B 33/142 360/97.15 |
| 2004/0057203 A1* | 3/2004 | Rabinovitz | G06F 1/184 361/679.31 |
| 2004/0057211 A1* | 3/2004 | Kondo | G06F 1/20 361/696 |
| 2006/0181845 A1* | 8/2006 | Shah | G11B 33/12 361/679.4 |
| 2007/0042514 A1* | 2/2007 | Wu | G06F 1/183 438/17 |
| 2007/0297136 A1* | 12/2007 | Konshak | H05K 7/20772 361/699 |
| 2017/0049010 A1* | 2/2017 | Campbell | H05K 7/20836 |

\* cited by examiner

EXTERNALLY-COOLED TAPE DRIVE

CROSS-REFERENCE TO RELATED APPLICATIONS

The present application claims priority under 35 U.S.C. § 119(e) to U.S. Provisional Patent Application No. 62/814,029, filed Mar. 5, 2019, for all purposes.

BACKGROUND

The electrical components of modern computing systems generate significant amounts of heat. Overheating of the components may compromise their performance and/or cause damage thereto. Computing systems therefore typically employ systems for cooling their constituent electrical components.

For example, mechanical cooling may provide a cool and controlled environment for the operation of conventional tape drives. Adiabatically- or fresh air-cooled datacenters are often preferred due to the costs of mechanical cooling. However, the former cooling techniques require airflow directed through the tape drives. This airflow causes temperature and humidity fluctuations within the drives and causes the drives to ingest dust and particulates. Any of these factors can negatively affect tape media integrity and I/O.

Systems are desired to cool tape drives in a cost-effective manner while addressing the shortcomings of traditional airflow-based cooling.

DETAILED DESCRIPTION

The following description is provided to enable any person in the art to make and use the described embodiments. Various modifications, however, will remain readily-apparent to those in the art.

Some embodiments may provide efficient and cost-effective cooling of tape drives in a computing environment, while reducing a need to route air through the internal structure of a tape drive. By reducing this need, media integrity and/or I/O reliability may be improved, as compared to prior cost-saving cooling designs.

Generally, some embodiments provide a tape drive in which one or more passive cooling systems (e.g., heat pipes, vapor chambers, Peltier coolers) direct heat from internal components (e.g., integrated circuits, motors) to a remote cooling system (e.g., a fan-cooled radiator). The foregoing arrangement may reduce a need to provide cooling airflow within the tape drive. This advantage allows placement of the tape drive within an environment that is substantially sealed from external ambient air, while the remote cooling system is located outside of the sealed environment. Consequently, temperature and humidity fluctuations as well as particulate contamination within the tape drive may be reduced. The sealed environment may comprise a tape library including several tape drives, each of which is configured as described herein.

Figure 1:
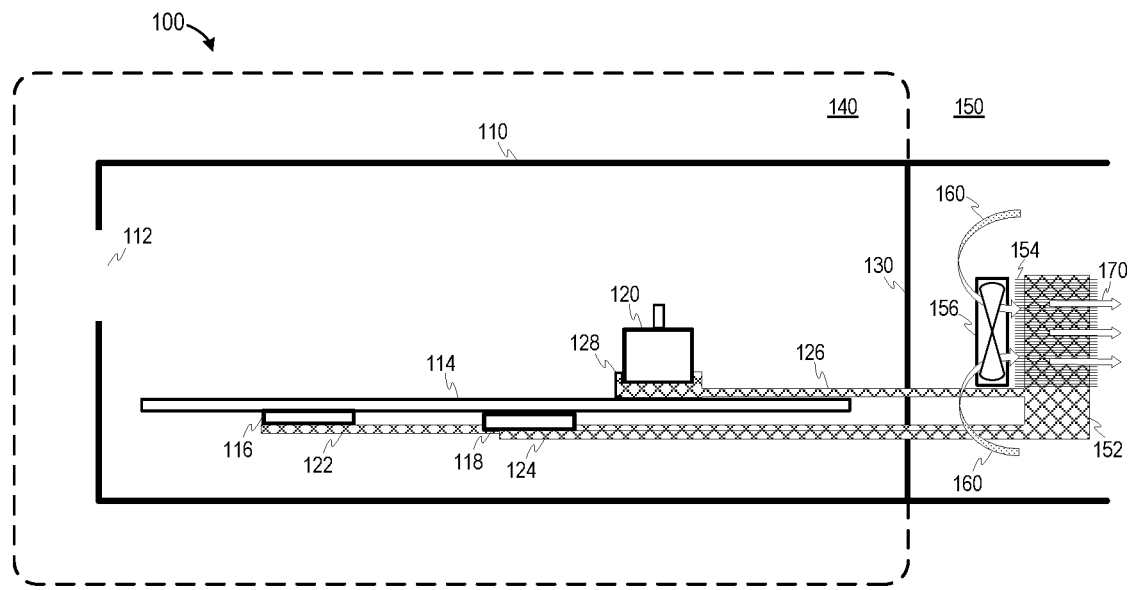
FIG. 1 is a cutaway side view of a system according to some embodiments.
Figure 2:
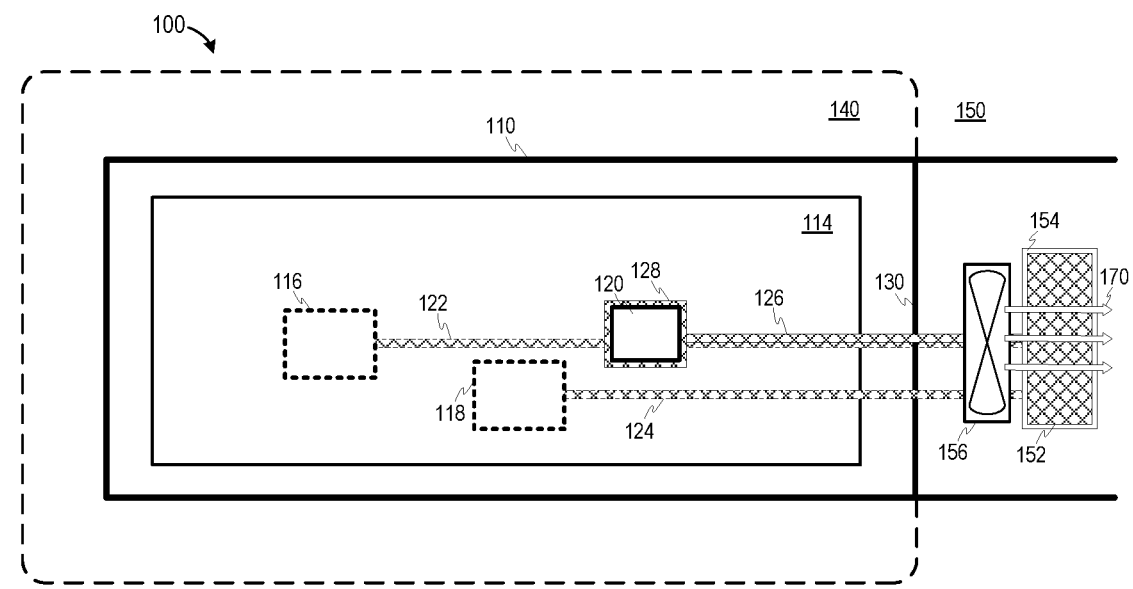
FIG. 2 is a cutaway top view of a system according to some embodiments.

FIG. 1 is a cutaway side view and FIG. 2 is a cutaway top view of system 100 according to some embodiments. Embodiments are not limited to the configuration illustrated in FIGS. 1 and 2. System 100 may comprise a mechanical drive for reading and/or writing electronic data from/to tape media. System 100 includes housing 110 defining opening 112 to receive a tape cassette holding tape media. Housing 110 also includes several internal elements which operate in conjunction with one another to provide the intended functionality of system 100. Embodiments are not limited to the internal elements described herein. Embodiments may include any type, number and arrangements of internal tape drive components that are or become known.

System 100 includes printed circuit board (PCB) 114 on which integrated circuits 116 and 118 are mounted. Integrated circuits 116 and 118 may comprise application-specific integrated circuits (ASICs) as is known in the art. Embodiments may employ any number and/or type of integrated circuits.

Motor 120 is also mounted on PCB 114. Motor 120 is controlled to rotate a take-up reel (not shown) of a tape cassette via an interface (e.g., a spindle) which mates with the reel. Such rotation causes tape media of the tape cassette to move past a tape head (also not shown) of system 100. Embodiments may provide any system for causing relative motion between a tape head and tape media.

Integrated circuit 116, integrated circuit 118 and motor 120 all produce heat during operation. First ends of each of thermally-conductive elements 122, 124 and 126 are thermally-coupled to respective components 116, 118 and 120 to draw heat away from their respective components. Motor 120 is thermally-coupled to thermal pad 128, which is in turn thermally-coupled to (e.g., in contact with) element 126.

In FIGS. 1 and 2, elements to the left of barrier 130 are located within substantially-sealed environment 140. As will be described below, environment 140 may comprise a tape library, but embodiments are not limited thereto. Environment 140 may be defined by any suitable enclosure. The sealing of environment 140 may prevent significant air intrusion into housing 110 and also reduce temperature and humidity fluctuations within housing 110. Such sealing may comprise applying thermal sealant to any seams of or openings in the enclosure.

Second ends of each of thermally-conductive elements 122, 124 and 126 are thermally-coupled to radiator 152 including fins 154. Radiator 152 is cooled by fan 156, which takes in air 160 and expels air 170 around radiation 152. Either or both of radiator 152 and fan 156 may be substituted with or augmented by any other type of heat dissipation systems that are or become known.

Radiator 152 and fan 156 are located in environment 150 which is located outside environment 140. Environment 150 may comprise ambient air within a data center. In such an embodiment, barrier 130 may shield components inside housing 110 from ambient heat, while radiator 152 and fan 154 move heat received from internal components into ambient environment 150. Barrier 130 may be lined with thermally-insulating material (e.g., Styrofoam) to prevent heat from entering housing 110 and thereby reducing an amount heat to be removed from housing 110.

According to some embodiments, one or more of thermally-conductive elements 122, 124 and 126 is a heat pipe which defines at least one internal passage containing a working fluid (e.g., Freon). In one example of operation, a first end of a thermally-conductive element absorbs heat from an internal component of housing 110 and the heat is transferred to the working fluid therein. The heat causes the fluid to change state from liquid to vapor, which travels along the element to a second end of the element and to a cold interface between the second end and radiator 152. The vapor condenses back into a liquid at the cold interface, thereby releasing latent heat. The liquid then returns to the first end through capillary action, centrifugal force, or gravity, and the cycle repeats. The working fluid mass may be selected so that the element contains both vapor and liquid over the operating temperature range.

The one or more thermally-conductive elements are not limited to the illustrated shapes and physical arrangement relative to the internal components. System 100 may include thermally-conductive material placed between an internal component 116, 118, 120 and its thermally-conductive element 122, 124, 126/128 to facilitate heat transfer therebetween. One or more of the thermally-conductive elements may be composed of any one or more thermally-conductive materials. In some embodiments, one or more of the thermally-conductive elements comprises solid copper or aluminum. Thermally-conductive elements may comprise heat pipes, vapor chambers, metal plates, radiators, etc. The thermally-conductive elements may be thermally-coupled to heat-generating and/or other elements within housing 110.

Figure 3:
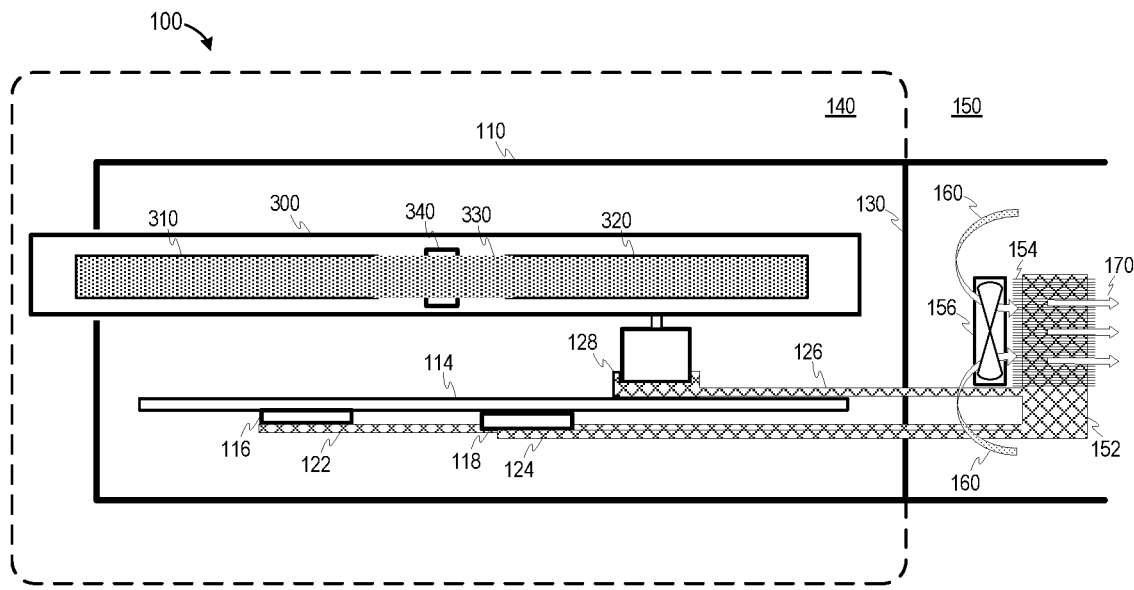
FIG. 3 is a cutaway side view of a system including a removeable tape cartridge according to some embodiments.
Figure 4:
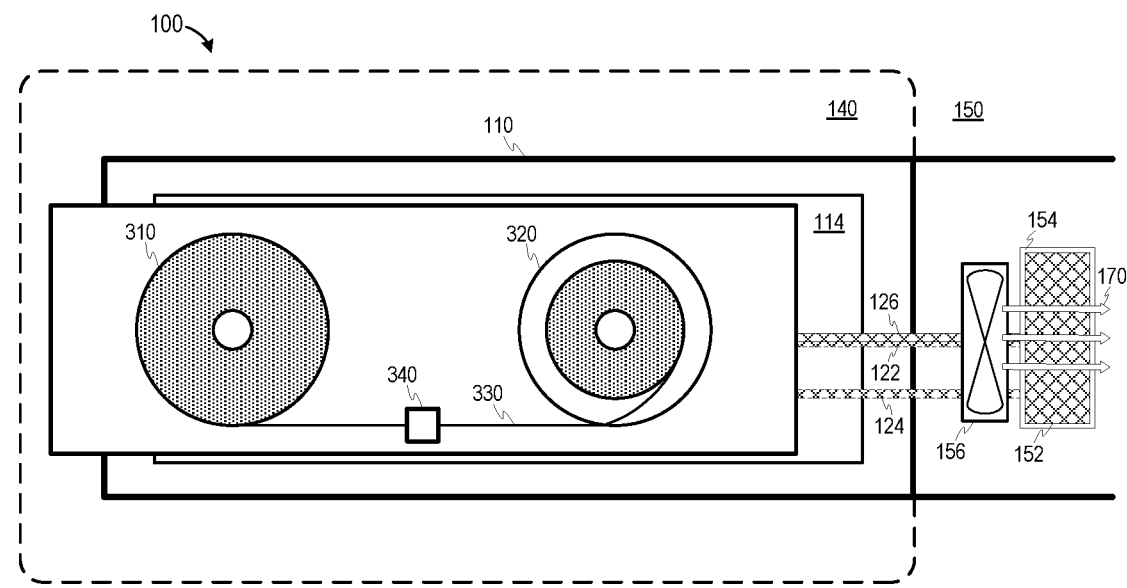
FIG. 4 is a cutaway top view of a system including a removeable tape cartridge according to some embodiments.

FIGS. 3 and 4 are additional views of system 100 according to some embodiments, in which tape cassette 300 has been inserted into opening 120. Tape cassette 300 includes reel 310 and take-up reel 320, which rotate to move tape media 330 past tape head 340 of system 100.

As shown, tape cassette 300 is located within environment 140 during operation of system 100. Accordingly, heat generated during the writing or reading of data to/from tape cassette 300 may be moved from sealed environment 140 to ambient environment 150 using the features described above.

Figure 5:
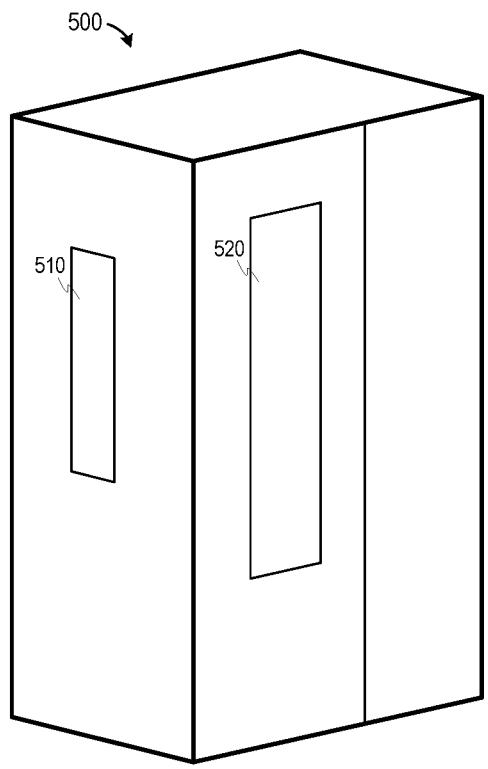
FIG. 5 is a front right perspective view of a tape library according to some embodiments.

FIG. 5 is a front right perspective view of tape library 500 according to some embodiments. Tape library 500 may hold many tape cassettes and one or more tape drives to read data from and write data to the tape cassettes. The tape cassettes and/or tape drives may be accessed through access panels 510 and 520. Tape library 500 may reside in a data center which may include additional tape libraries. Embodiments are not limited to a tape library of the configuration shown in FIG. 5.

Figure 6:
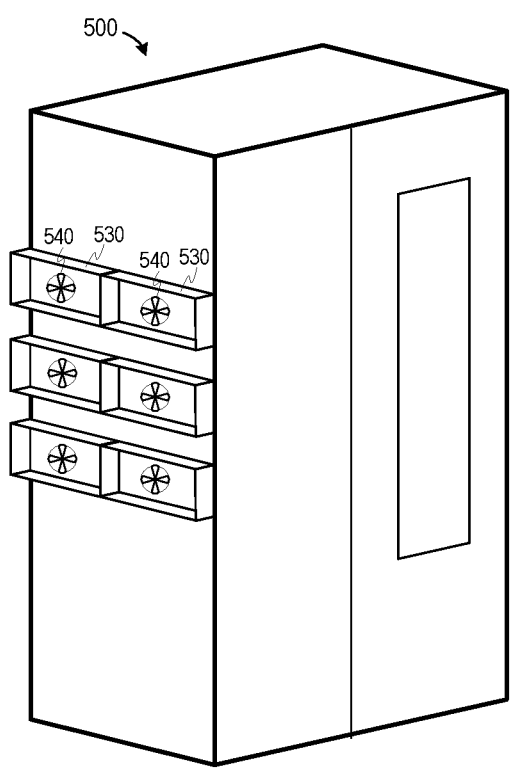
FIG. 6 is a back left perspective view of a tape library according to some embodiments.

FIG. 6 is a rear view of tape library 500 according to some embodiments. As shown, tape library 500 includes six tape drives 530, one or more of which may be configured similarly to system 100 of FIGS. 1 through 4. In contrast to system 100, fans 540 of drives 530 are located downstream of their associated radiators (not shown).

Accordingly, an interior volume of tape library 500 may comprise a sealed environment such as environment 140 and an exterior environment of library 500 may comprise an ambient environment such as environment 150. During operation, the features described herein may move heat away from the interior volume of tape library 500 and into ambient air of the exterior environment, while minimizing airflow within tape library 500.

Figure 7:
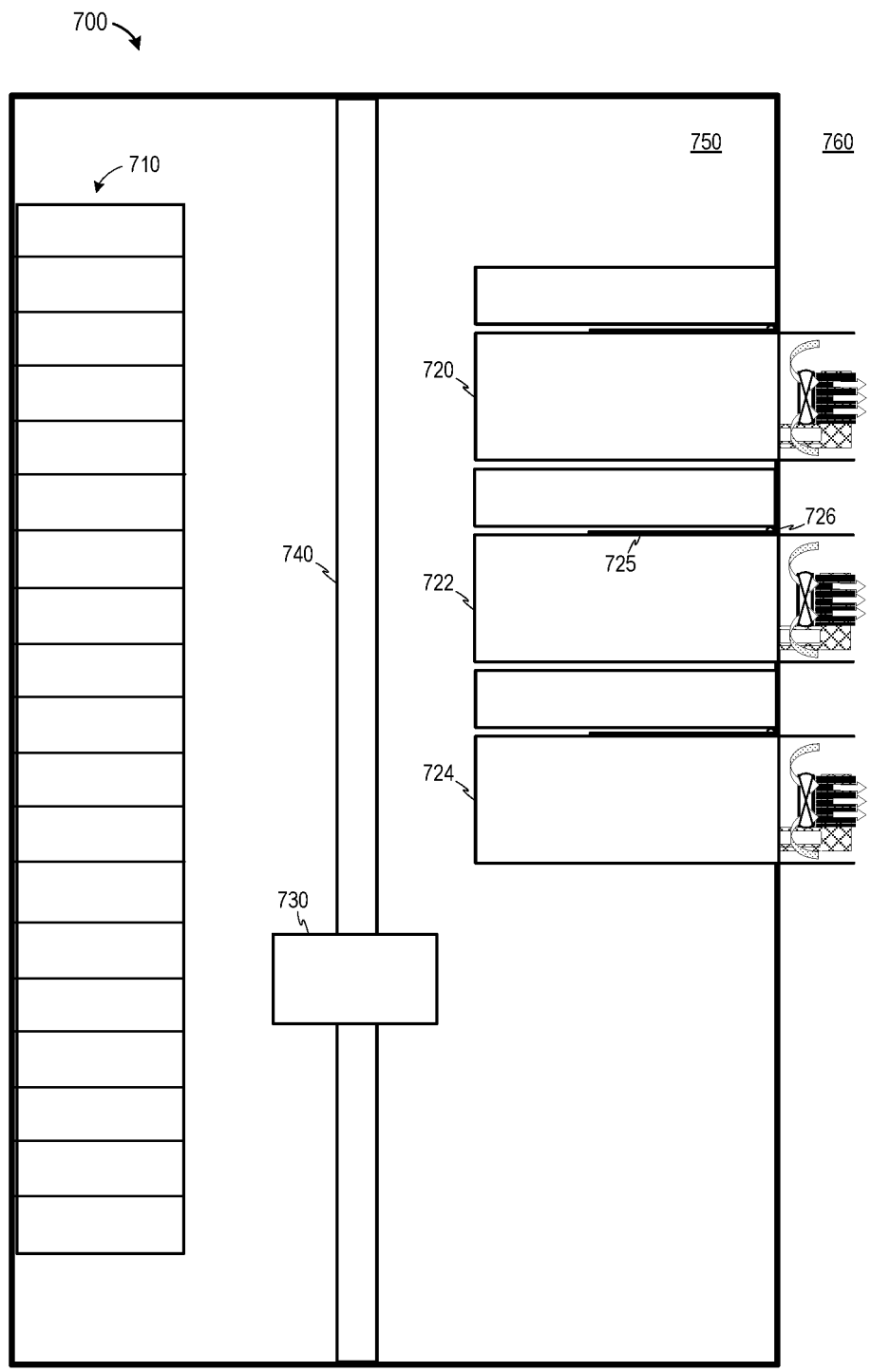
FIG. 7 is a cutaway side view of a tape library according to some embodiments.

FIG. 7 is a cutaway side view of tape library 700 according to some embodiments. Tape library 700 includes tape cassettes 710, tape drives 720, 722 and 724, robot arm 730 and robot shaft 740. In operation, and in response to a command from an external control system, robot arm 730 travels along shaft 740 to retrieve a selected one of tape cassettes 710. Robot arm 730 then travels along shaft 740 to insert the retrieved tape into one of tape drives 720, 722 and 724.

Tape drives 720, 722 and 724 may be configured as described with respect to system 100. Accordingly, interior volume 750 of tape library 700 may comprise a sealed substantially-controlled environment for internal components of tape drives 720, 722 and 724, and a heat dissipation unit of each of tape drives 720, 722 and 724 may be located in external environment 750. Embodiments are not limited to the elements or the arrangement thereof illustrated in FIG. 7.

Figure 8:
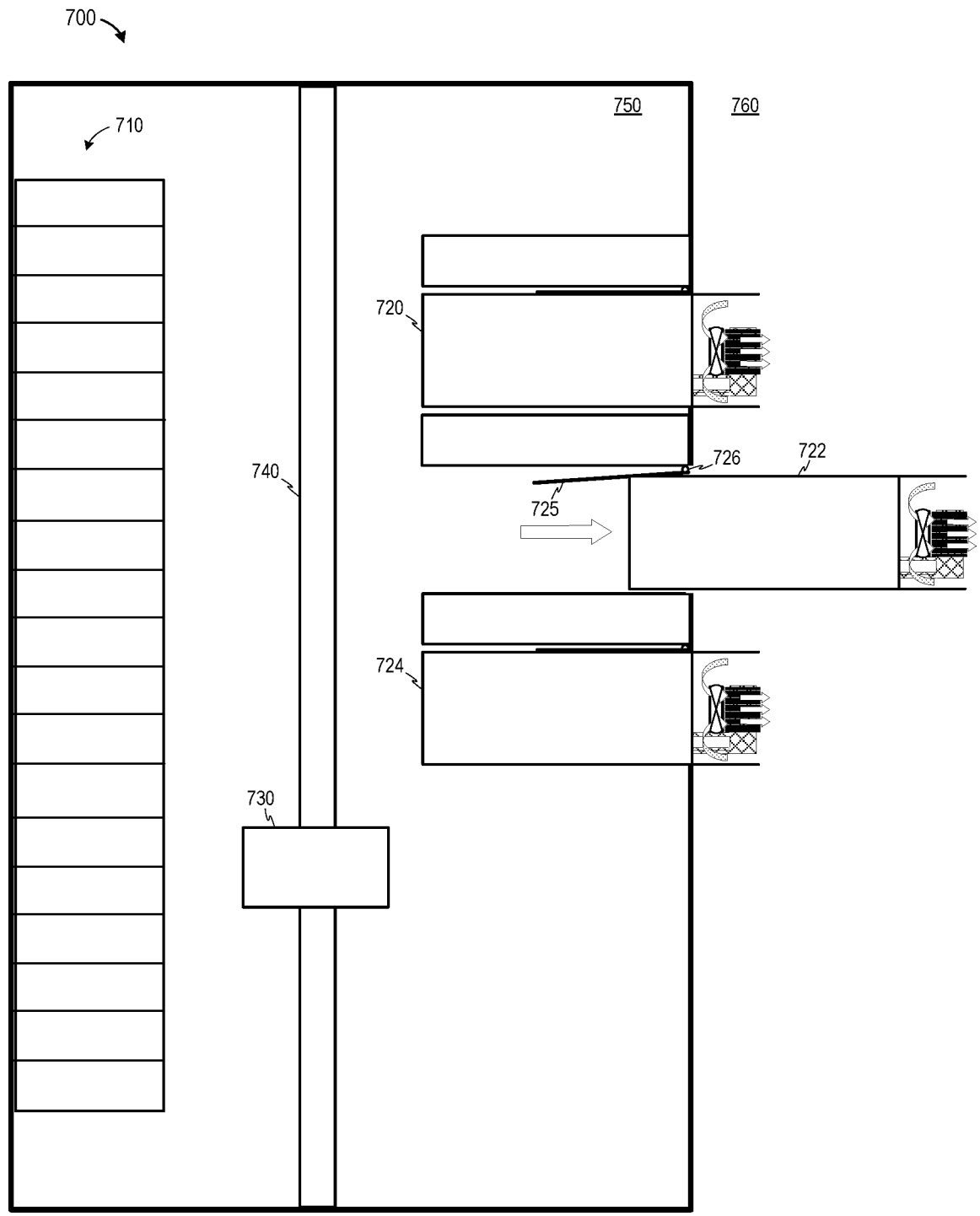
FIG. 8 is a cutaway side view of a tape library during drive removal according to some embodiments.
Figure 9:
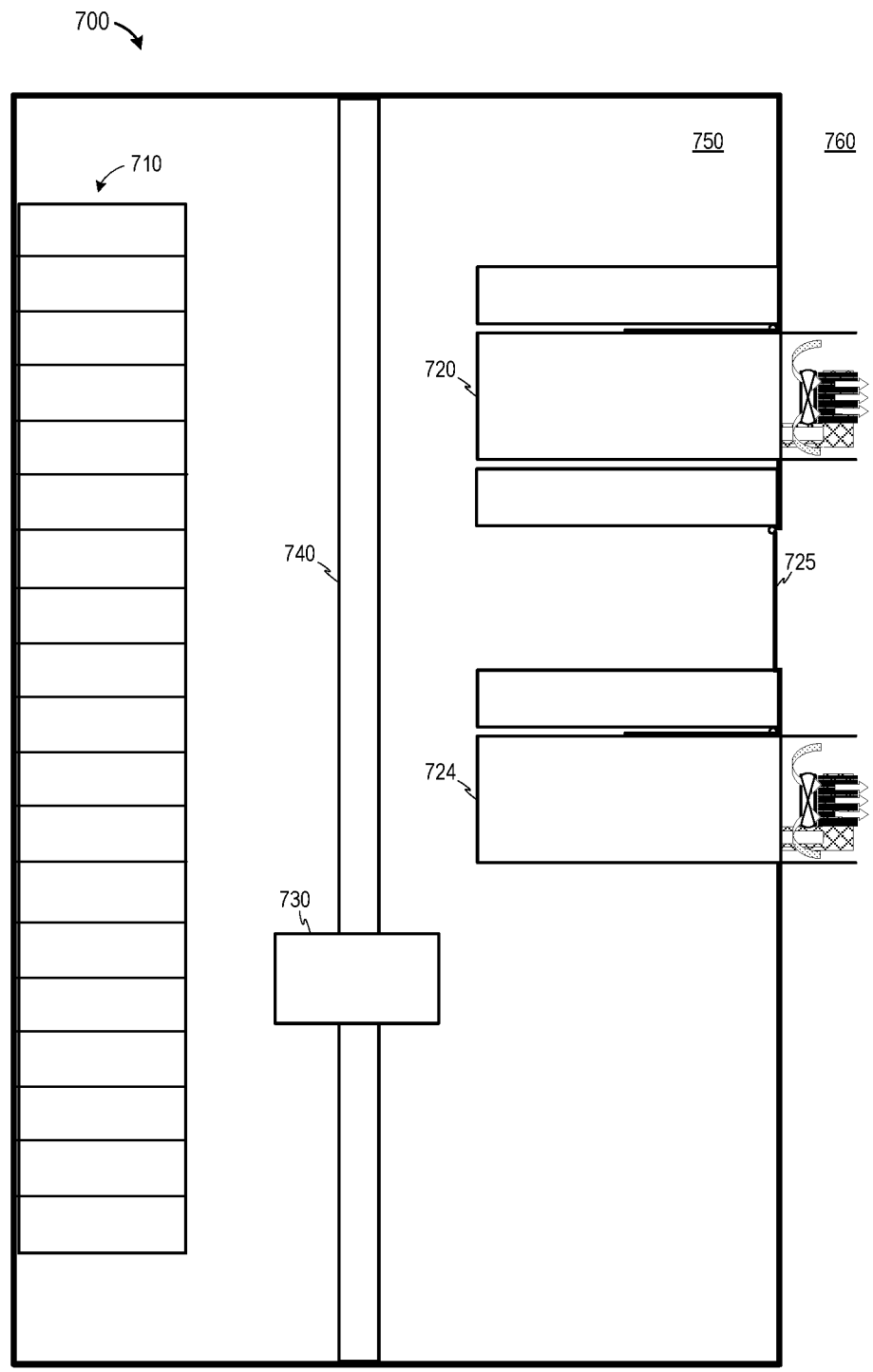
FIG. 9 is a cutaway side view of a tape library according to some embodiments.

Tape library 700 may be configured to maintain a substantially-sealed environment within interior volume 750 during removal or replacement of one of tape drives 720, 722 and 724. Panel 725 is biased against tape drive 722 via gravity and/or hinge 726. As shown in FIG. 8, as tape drive 722 is moved out of library 700, panel 725 rotates toward the opening through which tape drive 722 moves. Next, as shown in FIG. 9, removal of drive 722 results in panel 725 sealing the opening. Panel 725 may comprise a gasket or any other suitable means for suitably sealing the opening.

The foregoing diagrams represent examples of physical architectures for describing some embodiments, and actual implementations may include more or different components arranged in other manners. Moreover, each physical element, component or device described herein may be implemented by any physical elements, component or devices.

Embodiments described herein are solely for the purpose of illustration. Those in the art will recognize other embodiments may be practiced with modifications and alterations to that described above.

What is claimed is:

1. A tape drive comprising:
    a housing defining an internal volume;
    a heat-generating element disposed within the internal volume;
    a thermally-conductive element defining at least one internal passage including fluid, a first end of the thermally-conductive element in thermal communication with the heat-generating element; and
    a heat dissipation unit disposed in an external volume outside of the internal volume,
    wherein a second end of the thermally-conductive element is disposed in the external volume and is in thermal communication with the heat dissipation unit.

2. A system according to claim 1, wherein the internal volume is substantially sealed from the external volume.

3. A system according to claim 1, wherein the internal volume is disposed within an internal volume of a tape library, and the external volume is an ambient environment of a data center.

4. A system according to claim 3, wherein the tape library comprises a second tape drive, the second tape drive comprising:
    a second housing defining a second internal volume;
    a second heat-generating element disposed within the second internal volume;

a second thermally-conductive element, a first end of the second thermally-conductive element in thermal communication with the second heat-generating element; and a second heat dissipation unit disposed in the external volume, the external volume being outside of the second internal volume, wherein a second end of the second thermally-conductive element is disposed in the external volume and is in thermal communication with the heat dissipation unit.

5. A system according to claim 1, further comprising:

a second heat-generating element disposed within the internal volume; and a second thermally-conductive element, a first end of the second thermally-conductive element in thermal communication with the second heat-generating element, wherein a second end of the second thermally-conductive element is disposed in the external volume and is in thermal communication with the heat dissipation unit.

6. A system according to claim 1, wherein the heat dissipation unit is a passive radiator.

7. A tape library comprising:

a substantially-sealed library housing;

a plurality of tape cassettes disposed within the library housing; and a tape drive; and a mechanism disposed in the library housing, the mechanism to select one of the plurality of tape cassettes and insert the selected tape cassette into the opening of the tape drive, the tape drive comprising:

a tape drive housing, the tape drive housing defining an opening to receive a tape cassette, defining an internal volume disposed within the library housing, and defining an external volume disposed outside of the library housing;

a heat-generating element disposed within the internal volume;

a thermally-conductive element, a first end of the thermally-conductive element in thermal contact with the heat-generating element; and a heat dissipation unit disposed in the external volume, wherein a second end of the thermally-conductive element is disposed in the external volume and is in thermal contact with the heat dissipation unit.

8. A tape library according to claim 7, wherein the heat dissipation unit comprises a radiator and a fan.

9. A system according to claim 7, wherein the external volume is an ambient environment of a data center.

10. A system according to claim 7, the tape library further comprising:

a second tape drive comprising:

a second tape drive housing, the second tape drive housing defining a second opening to receive a tape cassette, defining a second internal volume disposed within the library housing, and defining a second external volume disposed outside of the library housing;

a second heat-generating element disposed within the second internal volume;

a second thermally-conductive element, a first end of the second thermally-conductive element in thermal contact with the second heat-generating element; and a second heat dissipation unit disposed in the second external volume, wherein a second end of the second thermally-conductive element is disposed in the second external volume and is in thermal contact with the second heat dissipation unit.

11. A system according to claim 7, the tape drive further comprising:

a second heat-generating element disposed within the internal volume; and a second thermally-conductive element, a first end of the second thermally-conductive element in thermal communication with the second heat-generating element, wherein a second end of the second thermally-conductive element is disposed in the external volume and is in thermal communication with the heat dissipation unit.

12. A system according to claim 7, wherein the tape drive is disposed within an opening of the library housing, with the internal volume disposed on one side of the opening and the external volume disposed on another side of the opening, the tape library further comprising:

an element to seal the opening in the absence of the tape drive.

13. A system according to claim 12, wherein the element is biased against the tape drive housing by a biasing element as the tape drive is disposed within the opening of the library housing, and wherein the biasing element biases the element again the library housing to seal the opening in the absence of the tape drive.

14. A tape drive comprising:

a system to read tape media stored in a tape cassette, the system comprising a heat-generating element;

a thermally-conductive element defining at least one internal passage including fluid, a first end of the thermally-conductive element coupled to the heat-generating element;

a heat dissipation unit, wherein a second end of the thermally-conductive element is coupled to the heat dissipation unit; and a heat-shielding barrier disposed between the heat-generating element and the heat dissipation unit.

15. A tape drive according to claim 14, the system further comprising a second heat-generating element, and the tape drive further comprising:

a second thermally-conductive element, a first end of the second thermally-conductive element coupled to the second heat-generating element, wherein a second end of the second thermally-conductive element is coupled to the heat dissipation unit, and wherein the thermally-conductive element and the second thermally-conductive element pass through the heat-shielding barrier.

16. A tape drive according to claim 14, wherein the heat dissipation unit comprises a fan and a passive radiator.

* * * * *